US012775535B2

(12) United States Patent
Kunchapu et al.

(10) Patent No.: US 12,775,535 B2
(45) Date of Patent: Oct. 27, 2026

(54) SER-DES TEST CHIP AND METHOD FOR MANAGING INTER-OPERABILITY DATA RATE RANGE

(71) Applicant: SAMSUNG ELECTRONICS CO., LTD., Suwon-si (KR)

(72) Inventors: Nageswara Rao Kunchapu, Bengaluru (IN); Praveen S Bharadwaj, Bengaluru (IN); Somasunder Kattepura Sreenath, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 479 days.

(21) Appl. No.: 18/131,221

(22) Filed: Apr. 5, 2023

(65) Prior Publication Data

US 2024/0338287 A1 Oct. 10, 2024

(51) Int. Cl.

| | |
|---|---|
| ***G06F 11/22*** | (2006.01) |
| ***G01R 31/3177*** | (2006.01) |
| ***G01R 31/3185*** | (2006.01) |
| ***G06F 11/273*** | (2006.01) |
| ***H04J 3/04*** | (2006.01) |
| ***H04L 47/10*** | (2022.01) |

(Continued)

(52) U.S. Cl.

CPC ...... *G06F 11/2221* (2013.01); *G01R 31/3177* (2013.01); *G01R 31/318572* (2013.01); *G01R 31/318583* (2013.01); *G06F 11/2273* (2013.01); *G06F 11/2736* (2013.01); *H04J 3/04* (2013.01); *H04L 47/10* (2013.01); *H04L 47/30* (2013.01); *H04L 67/1097* (2013.01)

(58) Field of Classification Search

CPC ............. G06F 11/2221; G06F 11/2273; G06F 11/2236; G06F 11/2736; G01R 31/3177; G01R 31/318572; G01R 31/318583; H04J 3/04; H04J 3/07; H04L 49/356; H04L 45/245; H04L 67/1097; H04L 49/357; H04L 47/30; H04L 47/10

See application file for complete search history.

(56) References Cited

U.S. PATENT DOCUMENTS 6,970,013 B1 11/2005 Cory
7,091,890 B1 8/2006 Sasaki et al.
8,325,714 B2 12/2012 Giorgetta et al.

(Continued)

FOREIGN PATENT DOCUMENTS

CN 114527372 A * 5/2022 ......... G01R 31/2851
WO WO-2011153107 A1 * 12/2011 ............. G06F 13/16
WO WO-2020108589 A1 * 6/2020 ............. H04L 27/04

OTHER PUBLICATIONS

English translation version of CN 114527372 A, Publication Date: May 24, 2022, retrieved from PE2E search on May 18, 2026 (Year: 2022) (Year: 2022).*

(Continued)

*Primary Examiner* — Omar J Ghowrwal
*Assistant Examiner* — Sanaa Al Samahi
(74) *Attorney, Agent, or Firm* — Sughrue Mion, PLLC

(57) ABSTRACT

There is provided a method for managing the inter-operability data rate range of serializer/deserializer (Ser-Des) test chips. The method doubles the inter-operability data rate range of the Ser-Des test chip, reduces the skew on data pins, and thereby increases the performance in the inter-operability test of the Ser-Des test chip.

20 Claims, 6 Drawing Sheets

(51) Int. Cl.
*H04L 47/30* (2022.01)
*H04L 67/1097* (2022.01)

(56) References Cited

U.S. PATENT DOCUMENTS

| | | | | |
|---|---|---|---|---|
| 8,477,831 | B2 | 7/2013 | Vijayaraghavan et al. | |
| 8,582,705 | B2 | 11/2013 | Frankel et al. | |
| 8,837,467 | B2 | 9/2014 | Kyles et al. | |
| 9,739,834 | B1 * | 8/2017 | Azimi | G01R 31/3177 |
| 10,069,513 | B2 | 9/2018 | Lee | |
| 10,778,404 | B1 | 9/2020 | Farjadrad | |
| 11,068,369 | B2 * | 7/2021 | Wang | G06F 11/2273 |
| 2005/0163168 | A1 * | 7/2005 | Sheth | H04J 3/04 370/537 |
| 2007/0047589 | A1 * | 3/2007 | Modaress-Razavi | H03M 9/00 370/535 |
| 2008/0205437 | A1 * | 8/2008 | Cole | H04J 3/047 370/464 |
| 2016/0192360 | A1 * | 6/2016 | Lee | H04W 4/70 370/336 |
| 2020/0356504 | A1 * | 11/2020 | Farjadrad | H01L 25/0655 |
| 2021/0116503 | A1 * | 4/2021 | Tokuz | G01R 31/318572 |
| 2023/0038814 | A1 * | 2/2023 | Grant | H03M 9/00 |
| 2025/0007516 | A1 * | 1/2025 | Kumar | H04L 25/0296 |

OTHER PUBLICATIONS

English translation version of WO 2020108589 A1, Publication Date: Jun. 4, 2020, retrieved from PE2E search on May 18, 2026 (Year: 2020) (Year: 2020).*

* cited by examiner

SER-DES TEST CHIP AND METHOD FOR MANAGING INTER-OPERABILITY DATA RATE RANGE

BACKGROUND

1. Field

The disclosure relates to serializer/deserializer (Ser-Des) test chips and methods for testing Ser-Des test chips, and more particularly to Ser-Des test chips for managing the inter-operability data rate range.

2. Description of Related Art

In general, electronic devices, such as portable or mobile devices include input/output (I/O) devices. These I/O devices may include pads, displays, cameras, general purpose I/O (GPIO) devices etc. In the electronic devices, interconnection between a microprocessor and the I/O devices require multiple parallel connections to traverse a flexible cable squeezed into a hinge. However, large numbers of physical wires are undesirable due to decreased reliability and increased costs.

A serializer/deserializer (Ser-Des) is a transmission system that transmits signals over a high-speed connection from a transceiver on one chip to a receiver on another chip, and reduces the number of physical wires. The transceiver converts parallel data into a serial stream data which is re-translated into parallel data on the receiving end. The Ser-Des devices are currently tested using an on-chip serial feedback, or a wired on-the-board serial feedback. Any faults that are identified during testing can be rectified only after a system-on-a-chip (SoC) development which is a delayed process and is very expensive.

A separate test chip can be used to determine the Ser-Des interoperability (IP) and the interoperability can be verified using an external link. For example, the link logic can be in a different chip or can be in a reconfigurable environment or any other environment. The Ser-Des testing chips are designed with a GPIO speed limit. For example, the GPIO speed limit is up to 100 MHZ and an interoperability of the Ser-Des has to be verified using a multi-layered test chip having layers such as an upper layer, a link layer, and a MAC layer. If the test chip tries to drive the data beyond 100 MHZ, then the amount of testing on the Ser-Des may be interrupted or limited due to the GPIO speed limit. Thus, the data rate for interoperability of Ser-Des test chip is limited by the speed of I/O used for parallel interface. Further, the skew on the data pins is a major challenge for performance in the inter-operability test.

SUMMARY

According to an aspect of the disclosure, there is provided a serializer/deserializer (Ser-Des) test chip with enhanced inter-operability data rate range.

According to an aspect of the disclosure, there is provided a Ser-Des test chip having enhanced inter-operability with higher layers.

According to an aspect of the disclosure, there is provided a method that doubles the inter-operability data rate range of the Ser-Des test chip.

According to an aspect of the disclosure, there is provided a method that reduces the skew on data pins and increases the performance in the inter-operability test of the Ser-Des test chip.

According to an aspect of the disclosure, there is provided a method for managing an interoperability data rate range of a serializer/deserializer (Ser-Des) test chip, the method including: receiving, by a transmitter circuit of the Ser-Des test chip, a data rate of at least one input data from an external device; enabling a first transmit path for transferring the at least one input data for performing Direct Current (DC) level tests based on the data rate of the at least one input data being a first very low data rate or a first constant data signal, the first very low data rate being below a reference data rate; enabling a second transmit path for a single data transfer rate based on the data rate of the at least one input data being less than an Input/Output (I/O) speed limit; enabling the second transmit path to increase a data bus width for the single data transfer rate based on the data rate of the at least one input data being more than the I/O speed limit and based on a required number of I/O pins available at an interface of the Ser-Des test chip; and enabling a third transmit path for doubling data transfer rate based on the data rate of the at least one input data being more than the I/O speed limit.

The method may further include: determining, by the external device, the data rate of the at least one input data received at a plurality of I/O pins.

The method may further include: receiving, by a receiver circuit of the Ser-Des test chip, a data rate of an output data from the external device; enabling a first receive path for receiving the output data for performing DC level tests based on the data rate of the output data being a second very low data rate or a second constant data signal, the second very low data rate being below the reference data rate; enabling a second receive path for the single data transfer rate based on the data rate of the output data being less than the I/O speed limit; enabling the second receive path for increasing the data bus width for the single data transfer rate based on the data rate of the output data being more than the I/O speed limit and based on a required number of I/O pins available at the interface of the Ser-Des test chip; and enabling a third receive path for doubling the data transfer rate based on the data rate of the output data being more than the I/O speed limit and the data bus width is limited.

The method may further include: determining, by the external device, the data rate of the output data received at a Ser-Des interoperability (IP).

The first transmit path or the first receive path may be a bypass path, the second transmit path or the second receive path may be a single data rate (SDR) path, and the third transmit path or the third receive path may be a double data rate (DDR) path.

The SDR path may utilize a width converter for increasing the data bus width based on the data rate of the output data being more than the I/O speed limit.

The DDR path may utilize a data sampling technique and a data splitter for providing the double data rate, and the data sampling technique may be based on a combination of the SDR and the DDR.

The DDR path may utilize a logic to divide an output clock corresponding to the output data by two when driving the output data to the DDR path.

A combination of the bypass path, the SDR path, and the DDR path in the transmitter circuit and the receiver circuit may be implemented as a general purpose (I/O) (GPIO) adapter for communication between a first chip to a second chip.

According to another aspect of the disclosure, there is provided a serializer/deserializer (Ser-Des) test chip including: a transmitter circuit configured to: receive a data rate of at least one input data from an external device, and enable at least one transmit path from among a plurality of transmit paths based on the data rate of at least one input data, wherein the plurality of transmit paths includes: a first transmit path configured to transfer the at least one input data for performing Direct Current (DC) level tests based on the data rate of the at least one input data being a first very low data rate or a first constant data signal, the first very low data rate being below a reference data rate; a second transmit path configured for a single data transfer rate based on the data rate of the at least one input data being less than an I/O speed limit, and configured for increasing a data bus width for the single data transfer rate based on the data rate of the at least one input data being more than the I/O speed limit and based on a required number of I/O pins available at an interface of the Ser-Des test chip; and a third transmit path configured to doubling the data transfer rate based on the data rate of the at least one input data being more than the I/O speed limit.

The data rate of the at least one input data received at a plurality of input and output (I/O) pins may be determined by the external device.

The Ser-Des test chip further includes: a receiver circuit configured to: receive a data rate of an output data from the external device; and enable at least one receive path from among a plurality of receive paths based on the data rate of the output data, wherein the plurality of receive paths includes: a first receive path configured to receive the output data for performing the Direct Current (DC) level tests based on the data rate of the output data being a second very low data rate or a second constant data signal, the second very low data rate being below the reference data rate; a second receive path configured for the single data transfer rate based on the data rate of the output data being less than the I/O speed limit, and configured for increasing the data bus width for the single data transfer rate based on the data rate of the output data being more than the I/O speed limit and based on a required number of I/O pins available at the Ser-Des test chip interface; and a third receive path configured to double the data transfer rate based on the data rate of the output data being more than the I/O speed limit and the data bus width being limited.

According to another aspect of the disclosure, there is provided a method for managing an interoperability data rate range of a serializer/deserializer (Ser-Des) test chip, the method including: enabling, by a transmitter circuit of the Ser-Des test chip, at least one transmit path from among a bypass path, a single data rate (SDR) path, and a double data rate (DDR) path based on a data rate of at least one input data received at a plurality of input and output (I/O) pins of the Ser-Des test chip; and enabling, by a receiver circuit of the Ser-Des test chip, at least one receive path from among the bypass path, the SDR path, and the DDR path based on the data rate of an output data received from the external device, wherein the bypass path for transferring the at least one input data for performing Direct Current (DC) level tests is enabled by the transmitter circuit based on the data rate of the at least one input data being a first very low data rate or a first constant data signal, the first very low data rate being below a reference data rate, wherein the SDR path for a single data transfer rate is enabled by the transmitter circuit based on the data rate of the at least one input data being less than an Input/Output (I/O) speed limit, wherein the SDR path for increasing a data bus width for the single data transfer rate is enabled by the transmitter circuit based on the data rate of the at least one input data being more than the I/O speed limit and based on a required number of I/O pins available at the Ser-Des test chip interface, wherein the DDR path for doubling the data transfer rate is enabled by the transmitter circuit based on the data rate of the at least one input data being more than the I/O speed limit, wherein the bypass path for receiving the output data for performing Direct Current (DC) level tests is enabled by the receiver circuit based on the data rate of the output data being a second very low data rate or a second constant data signal, the second very low data rate being below the reference data rate, wherein the SDR path for the single data transfer rate is enabled by the receiver circuit based on the data rate of the output data being less than the I/O speed limit, wherein the SDR path for increasing the data bus width for the single data transfer rate is enabled by the receiver circuit based on the data rate of the output data being more than the I/O speed limit and based on a required number of I/O pins available at the Ser-Des test chip interface, and wherein the DDR path for doubling the data transfer rate is enabled by the receiver circuit based on the data rate of the output data being more than the I/O speed limit and the data bus width being limited, and wherein the DDR path divides an output clock corresponding to the output data by two.

According to another aspect of the disclosure, there is provided a serializer/deserializer (Ser-Des) test chip including: a transmitter circuit configured to enable at least one transmit path from among a bypass path, a single data rate (SDR) path, and a double data rate (DDR) path based on a data rate of at least one input data received at a plurality of input and output (I/O) pins from an external device; and a receiver circuit configured to enable at least one receive path from among the bypass path, the SDR path, and the DDR path based on the data rate of an output data received from the external logic module, wherein the bypass path for transferring the at least one input data for performing Direct Current (DC) level tests is enabled by the transmitter circuit based on the data rate of the at least one input data being a first very low data rate or a first constant data signal, the first very low data rate being below a reference data rate, wherein the SDR path for a single data transfer rate is enabled by the transmitter circuit based on the data rate of the at least one input data being less than an Input/Output (I/O) speed limit, wherein the SDR path for increasing a data bus width for the single data transfer rate is enabled by the transmitter circuit based on the data rate of the at least one input data being more than the I/O speed limit and based on a required number of I/O pins available at the Ser-Des test chip interface, wherein the DDR path for doubling the data transfer rate is enabled by the transmitter circuit based on the data rate of the at least one input data being more than the I/O speed limit, wherein the bypass path for receiving the output data for performing Direct Current (DC) level tests is enabled by the receiver circuit based on the data rate of the output data being a second very low data rate or a second constant data signal, the second very low data rate being below the reference data rate, wherein the SDR path for the single data transfer rate is enabled by the receiver circuit based on the data rate of the output data being less than the I/O speed limit, wherein the SDR path for increasing the data bus width for the single data transfer rate is enabled by the receiver circuit based on the data rate of the output data being more than the I/O speed limit and based on a required number of I/O pins available at the Ser-Des test chip interface, and wherein the DDR path for doubling the data transfer rate is enabled by the receiver circuit based on the data rate of the output data being more than the I/O speed limit and the data bus width being limited, and wherein the DDR path divides an output clock corresponding to the output data by two.

BRIEF DESCRIPTION OF DRAWINGS

Embodiment of the disclosure are illustrated in the accompanying drawings, throughout which like reference letters indicate corresponding parts in the various figures. The embodiment of the disclosure will be better understood from the following description with reference to the drawings, in which.

DETAILED DESCRIPTION

Figure 1:
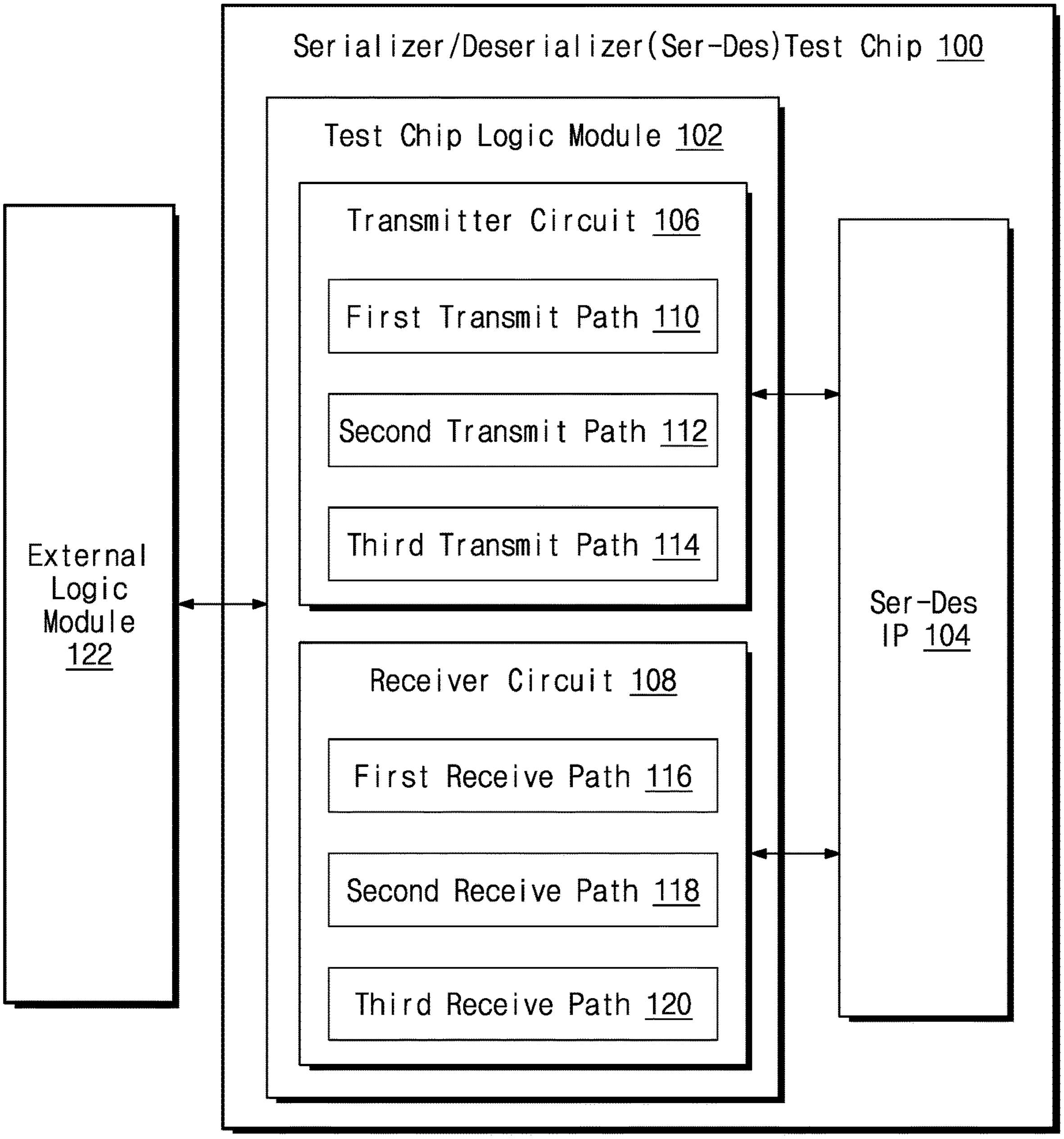
FIG. 1 illustrates a block representation of a serializer/deserializer (Ser-Des) test chip according to an example embodiment of the disclosure.

The embodiment of the disclosure and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiment of the disclosure. The examples used herein are intended merely to facilitate an understanding of ways in which the embodiment of the disclosure may be practiced and to further enable those of skill in the art to practice the embodiment of the disclosure. Accordingly, the examples should not be construed as limiting the scope of the embodiment of the disclosure.

One or more example embodiments of the disclosure achieve an enhanced interoperability data rate range of a serializer/deserializer (Ser-Des) test chip and reduced skew impact on data pins of the Ser-Des test chip. One or more example embodiments of the disclosure are illustrated with reference to FIGS. 1 through 6, where similar reference characters denote corresponding features consistently throughout the figures.

FIG. 1 illustrates a block representation of a serializer/deserializer (Ser-Des) test chip 100 according to an example embodiment. The Ser-Des test chip 100 includes a test chip logic module 102, and a Ser-Des interoperability (IP) 104. According to an example embedment, the test chip logic module 102 may include a transmitter circuit 106 and a receiver circuit 108. However, the disclosure is not limited thereto, and as such, according to another example embodiment, the test chip logic module 102 may be connected to a transmitter circuit 106 and a receiver circuit 108 provided in the serializer/deserializer (Ser-Des) test chip 100. An external logic module 122 is connected to the test chip logic module 102 of the Ser-Des test chip 100.

According to an example embodiment, the external logic module 122 receives at least one input data at a plurality of input and output (I/O) pins, transmits the input data and configures the Ser-Des test chip 100. The external logic module 122 is configured to decide a target data rate of the input data, configures the test chip logic module 102 of the Ser-Des test chip 100 to enable at least one data transmit path of the Ser-Des test chip 100 and transmit the input data at the target data rate. The data rate of the input data can be at least one of a very low data rate or constant data signal, the data rate less than an I/O speed limit, and the data rate more than the I/O speed limit. According to an example embodiment, a very low data rate may be a data rate below a reference value. According to an example embodiment, a constant data signal may be a data signal that remains at a constant level for a specific duration of time. For example, a constant data signal may refer to a constant high level or a constant low level.

According to an example embodiment, the external logic module 122 is configured to receive an expected data signal from an output data at the Ser-Des IP 104 based on the decided target data rate. The data rate of the output data can be at least one of the very low data rate or the constant data signal, the data rate less than the I/O speed limit, and the data rate more than the I/O speed limit. The external logic module 122 decides the target data rate, and configures the test chip logic module 102 of the Ser-Des test chip 100 to enable at least one data receive path of the Ser-Des test chip 100 based on the decided data rate.

According to an example embodiment, the test chip logic module 102 transmits a configuration signal to the transmitter circuit 106 based on data rate of the input data. According to another example embodiment, the test chip logic module 102 may configure one or more operations of the transmitter circuit 106 based on data rate of the input data. The transmitter circuit 106 includes a plurality of transmit paths to transmit the input data to the Ser-Des IP 104 of the Ser-Des test chip 100. The transmitter circuit 106 can enable at least one transmit path from the plurality of transmit paths based on the received configuration signal from the test chip logic module 102.

According to an example embodiment, the plurality of transmit paths includes a first transmit path 110, a second transmit path 112, and a third transmit path 114. The first transmit path 110 can transfer the input data for performing Direct Current (DC) level tests. The DC level tests can be performed based on a very low data rate or constant data signal on the input data. The DC level tests can be performed if the requirement is to test the interoperability (IP) DC level performance.

The DC level of the input data has to be in a balanced state to ensure better extraction and recovery of data and clock information. A continuous voltage level can lead to imbalance in DC levels which can cause difficulty in extracting and recovering the data and clock information. Therefore, the DC level tests have to be performed for better extraction and recovery of the data.

According to an example embodiment, the second transmit path 112 may be enabled for a single data transfer rate. The second transmit path 112 can be enabled based on the data rate of the input data which is less than the I/O speed limit. The I/O speed limit is a general purpose I/O (GPIO) speed limit which is defined by cell characteristics in that technology node and can be found from a data sheet of the GPIO.

According to an example embodiment, the second transmit path 112 may be further enabled for increasing a data bus width for the single data transfer rate. The data bus width is increased if the data rate of the input data is more than the I/O speed limit and a corresponding required number of I/O pins are available at the Ser-Des test chip interface. The required number of I/O pins available at the Ser-Des test chip interface is determined by the external logic module 122, if the data rate of the input data is more than the I/O speed limit.

According to an example embodiment, the third transmit path 114 may be enabled for doubling the data transfer rate. The data transfer rate can be doubled if the data rate is more than the I/O speed limit.

According to an example embodiment, the test chip logic module 102 transmits the configuration signal of the output data to the receiver circuit 108. According to another example embodiment, the test chip logic module 102 may configure one or more operations of the receiver circuit 108 based on data rate of the input data. The receiver circuit 108 incudes a plurality of receive paths to receive the output data from the Ser-Des IP 104 of the Ser-Des test chip 100. The receiver circuit 108 can enable at least one receive path from the plurality of receive paths based on the received configuration signal from the test chip logic module 102 which indicates the data rate decided by the external logic module 122.

According to an example embodiment, the plurality of receive paths includes a first receive path 116, a second receive path 118, and a third receive path 120. According to an example embodiment, the first receive path 116 can receive the output data for performing the DC level tests. The first receive path 116 may be used to perform the DC level tests when the target data rate of the received signal decided by the external logic module 122 is very low or constant.

According to an example embodiment, the second receive path 118 may be enabled when the data rate decided by the external logic module 122 is less than the I/O speed limit or when the output data needs to be driven at the single data transfer rate. The second receive path 118 may operate at increased data bus width for the single data transfer rate. The second receive path 118 may operate at increased data bus width on receiving indication from the test chip logic 102 that the data rate decided by the external logic module 122 is more than the I/O speed limit and based on a corresponding required number of I/O pins available at the Ser-Des test chip interface. The required number of I/O pins available at the Ser-Des test chip interface is determined by the external logic module 122, if the data rate of the output data is more than the I/O speed limit.

According to an example embodiment, the third receive path 120 may be enabled when the data rate of the output data decided by the external logic module 122 is more than the I/O speed limit and the data bus width is limited. The bus width is determined by the external logic module 122, if the data rate of the output data is more than the I/O speed limit.

According to an example embodiment, the I/O pins are general purpose I/O (GPIO) pins. The data lines of the transmitter circuit 106 and the receiver circuit 108 are connected to the GPIO pins through data contacts for enabling data communication between the Ser-Des test chip 100 and off chip circuit.

The GPIO speed limit may be configured using the GPIO output speed register. The GPIO speed refers to the GPIO transitions i.e., from high to low and low to high, which means the slew rate of a pin may be controlled by GPIO output speed register. The output speed register controls the slew rate of the GPIO switching.

According to an example embodiment, the first transmit path 110 and the first receive path 116 may be configured as a bypass path. According to an example embodiment, the second transmit path 112 and the second receive path 118 may be configured as a single data rate (SDR) path. The SDR path utilizes a width converter for increasing the data bus width, based on the data rate decided by the external logic module 122 where the data rate is more than the I/O speed limit.

According to an example embodiment, the third transmit path 114 and the third receive path 120 are configured as a double data rate (DDR) path. The DDR path utilizes a data sampling technique of a combination of an SDR and a DDR along with a data splitter for the double data transfer rate. The data splitter splits the data into a plurality of parts and converts only one part of the data. The DDR path utilizes a logic to divide an output clock of the output data by the number of parts on receiving indication from the test chip logic module 102 that the data rate is more than the I/O speed limit and the data bus width is limited. The output data is driven to the DDR path. According to an example embodiment, the data splitter splits the data into two parts and sends one part per clock cycle. The DDR path utilizes a logic to divide an output clock of the output data by two, when the output data needs to be driven at the DDR path.

The SDR path is configured for single data rate transmissions. For example, a single data rate transmission may refer to transmission of data only on one edge of the clock signal, e.g., either the rising or falling edge of a clock signal. The DDR path is configured for double data rate transmissions. For example, a double data rate transmission may refer to transmission of data on both rising and falling edges of the clock signal.

According to an example embodiment, combination of the bypass path, the SDR path, and the DDR path in the transmitter circuit 106 and the receiver circuit 108 is implemented for accomplishing communication between one chip to another chip as a GPIO adapter.

FIG. 1 shows example circuit components of the Ser-Des test chip 100, but it is to be understood that other example embodiments are not limited thereon. In other example embodiments, the Ser-Des test chip 100 may include less or more number of circuit components. Further, the labels or names of the circuit components are used only for illustrative purpose and does not limit the scope of the disclosure. One or more circuit components may be combined together to perform same or substantially similar function in the Ser-Des test chip 100.

Figure 2:
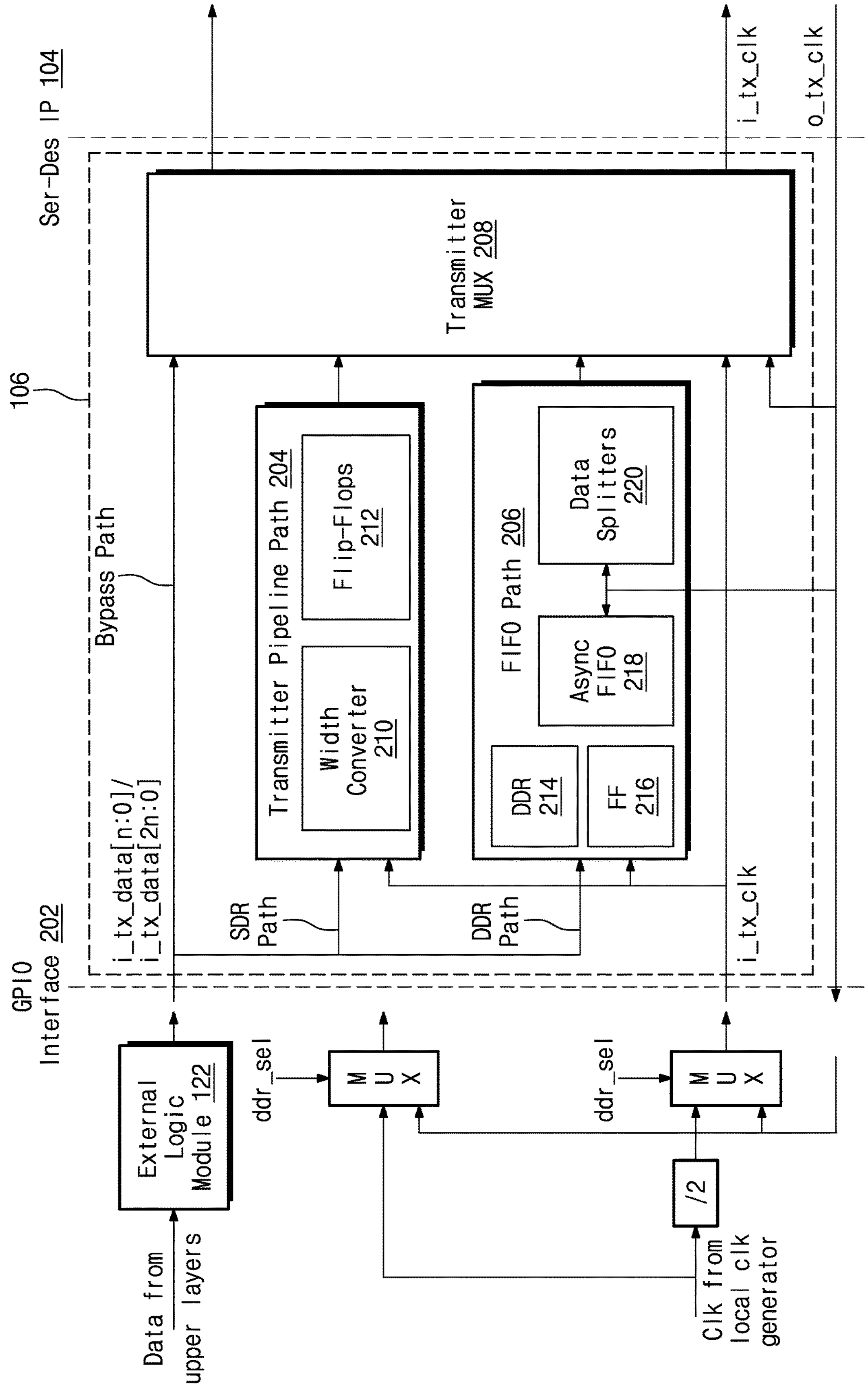
FIG. 2 illustrates a transmitter circuit of the Ser-Des test chip according to an example embodiment of the disclosure.

FIG. 2 illustrates a transmitter circuit 106 of the Ser-Des test chip 100 according to an example embodiment. The transmitter circuit 106 is connected to the external logic module 122 at a general input and output (GPIO) interface 202. The transmitter circuit 106 includes a transmitter pipeline path 204, a first-in-first-out (FIFO) path 206, and a transmitter multiplexer (MUX) 208. The transmitter circuit 106 further includes a bypass path, an SDR path, and a DDR path for the data transfer. The transmitter circuit 106 converts the low speed parallel data into high speed serial data. The input data to the transmitter circuit 106 is transmitted from the external logic module 122.

According to an example embodiment, the external logic module 122 is connected to the pins of the GPIO interface 202. The external logic module 122 transmits the data signal from the parallel input data which is received at the GPIO pins, as follows: (i_tx_data[n:0]/i_tx_data[2n:0]). The GPIO interface 202 of an integrated circuit (IC) includes multiple GPIO pins which may vary depending on the number of transmitter circuits used. The transmitter circuit 106 enables at least one of the bypass path, the SDR path, and the DDR path based on the data rate decided by the external logic module 122.

According to an example embodiment, the transmitter circuit 106 enables the bypass path, if the external logic module 122 indicates that the input data signal is a very low data rate or constant data signal. The bypass path transfers the input data with the very low data rate or constant data signal from the GPIO interface 202 to the transmitter MUX 208, for performing the DC level tests. For example, in case of DC level characterization, static zeroes or ones are needed. Therefore, in the bypass path, the external logic module 122 may simply receive continuous zeroes or ones.

According to an example embodiment, the transmitter circuit 106 enables the SDR path for the single data transfer rate, if the external logic module 122 indicates that the data rate is less than the I/O speed limit of the GPIO interface 202. The SDR path transfers the input data to the transmitter pipeline path 204 for allowing the single data transfer rate to the transmitter MUX 208 at the Ser-Des IP 104. For example, in cases where the latency level checks are needed, a simple pipeline path with low latency can deliver the data.

When the data rate is more than the I/O speed limit, then the external logic module 122 verifies the Ser-Des test chip 100 GPIO pins availability. If there is more than the required number of GPIO pins available at the GPIO interface 202, then the transmitter circuit 106 enables the SDR path for increasing a data bus width for the single data transfer rate. The SDR path transfers the input data to the transmitter pipeline path 204 for increasing the data bus width and allowing the single data transfer rate to the transmitter MUX 208 at the Ser-Des IP 104.

Further, the transmitter circuit 106 receives clock (clk) signals (i_tx_clk) from a local clock generator through multiple multiplexers (MUX). The multiplexers are provided with DDR select (ddr_sel) clk signals. The local clock generator includes a logic to divide the clk signal by 2, if the clk signal is given to the transmitter pipeline path 204 for providing single data transfer rate.

According to an example embodiment, the transmitter pipeline path 204 includes a width converter 210 and multiple flip-flops (FF) 212. The transmitter pipeline path 204 utilizes the flip-flops 212 and the clk signals to output the data with a single data transfer rate to the transmitter MUX 208, if the data rate is less than the I/O speed limit.

The transmitter pipeline path 204 utilizes the width converter 210 to operate at increased data bus width, if the data rate is more than the I/O speed limit. Further, the transmitter pipeline path 204 utilizes the flip-flops 212 and the clk signals to output the data with a single data transfer rate to the transmitter MUX 208, for the increased data bus width.

The flip flops are arranged to selectively receive one of a bit of data and data output from a preceding flip flop, and an output of a last flip flop for providing a serial stream of data.

According to an example embodiment, the transmitter circuit 106 enables the DDR path for doubling the data transfer rate, if the external logic module 122 indicates the data rate is more than the I/O speed limit. The DDR path transfers the input data to the FIFO path 206 for allowing double the data transfer rate to the transmitter MUX 208 at the Ser-Des IP 104.

The FIFO path 206 provides constant data throughput between two locations in a data path that might differ in their bandwidth or latency requirements.

Figure 3A:
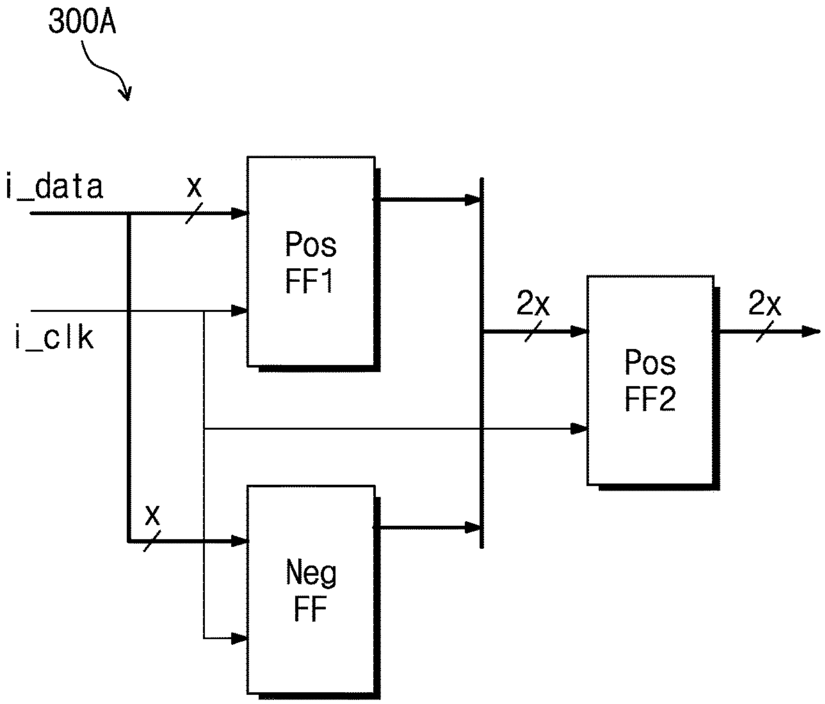
FIG. 3A illustrates a data sampling logic implemented by the DDR path according to an example embodiment of the disclosure.
Figure 3B:
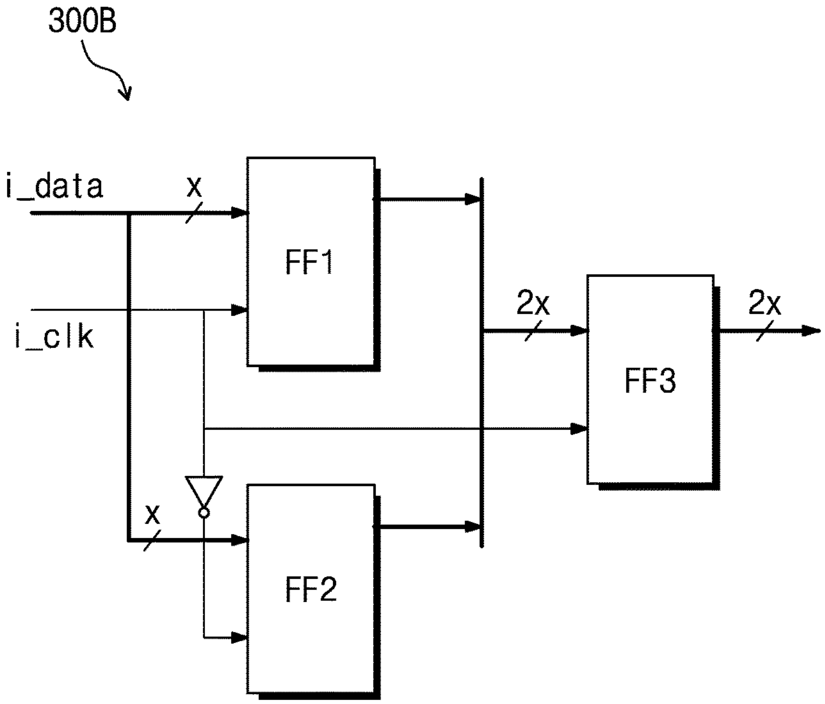
FIG. 3B illustrates another scenario of the data sampling logic implemented by the DDR path according to an example embodiment of the disclosure.
Figure 4:
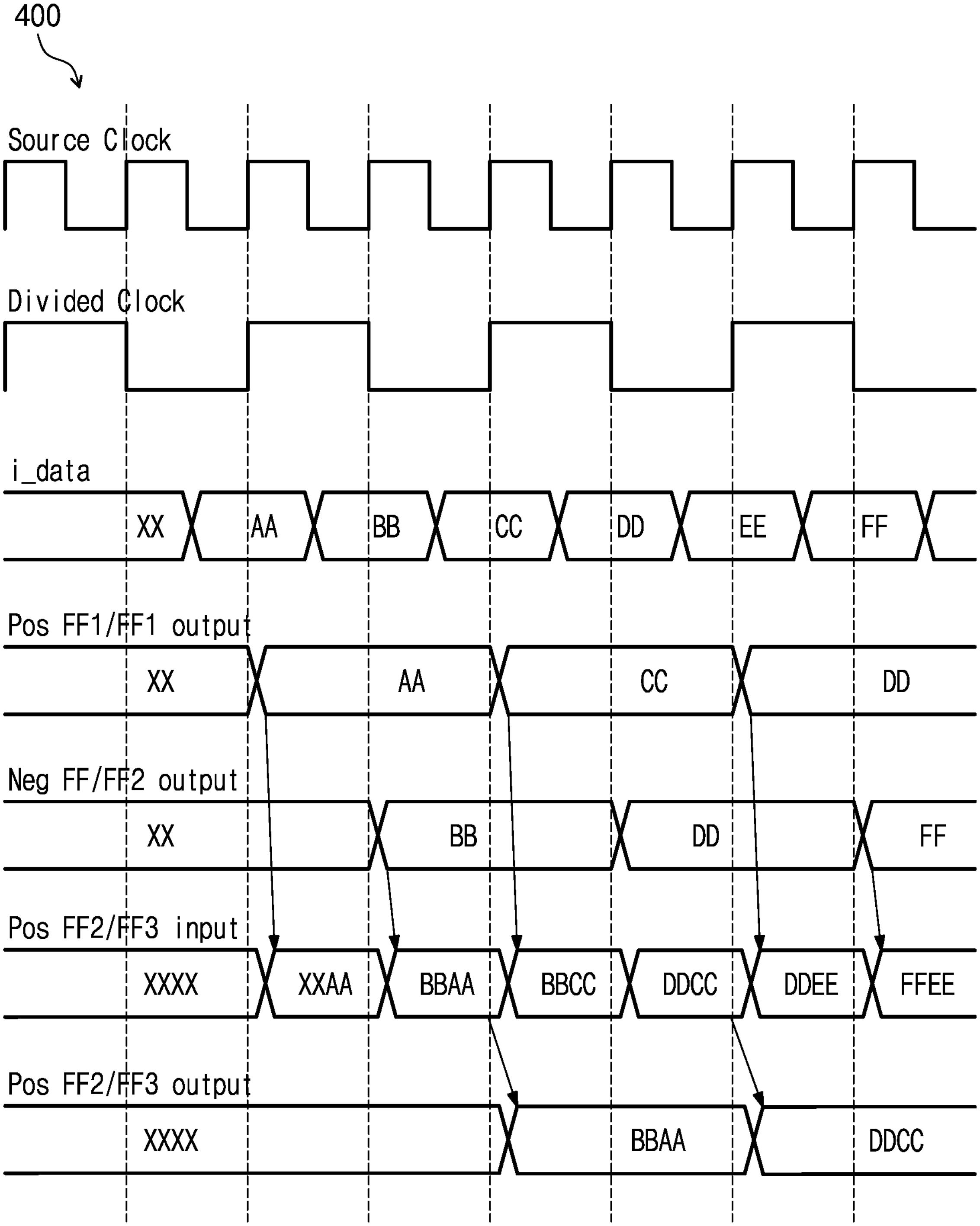
FIG. 4 illustrates waveforms of clock signals, input data, and output data of the data sampling logic according to an example embodiment of the disclosure.

According to an example embodiment, the FIFO path 206 includes a DDR 214, a flip-flop (FF) 216, asynchronous FIFO (Async FIFO) 218, and multiple data splitters 220. Here, the external logic module 122 drives the input data on both the edges of the clock signal. For example, the external logic module 122 drives the input data on rising and falling edges of the clock signal. The DDR 214 implements a logic to convert the data into SDR, if the data rate is more than the I/O speed limit. The FIFO path 206 utilizes the flip-flop 216 and clk signals for data conversion. The DDR 214 implements a data sampling technique of a combination of the SDR and the DDR. The data sampling technique is depicted in FIGS. 3A, 3B and 4.

However, when the external logic module 122 drives the input data in both the edges of the clock signal, the same clock signals cannot be used for transferring the data to Ser-Des test chip 100 as the clock speed is lower. Therefore, the asynchronous FIFO 218 is utilized to transfer the data from an external clock domain to the Ser-Des clock domain.

The asynchronous FIFO 218 is a FIFO where the data values are written to the FIFO at a different rate and data values are read from the same FIFO at a different rate, both at the same time. Here, the read and write clocks are not synchronized.

The data from the asynchronous FIFO 218 may be then converted into actual width using multiple data splitters 220. The width conversion is implemented by sampling half the bus width per each clock cycle in the sampling domain. Thus, the output from the data splitter 220 provides double the data transfer rate to the transmitter MUX 208 at the Ser-Des IP 104. Further, a feedback loop of clock signals from the Ser-Des IP 104 is fed to the transmitter MUX 208, data splitters 220, and multiplexers of the local clk generator.

FIG. 2 shows example components of the transmitter circuit 106, but it is to be understood that other example embodiments are not limited thereon. In other example embodiments, the transmitter circuit 106 may include less or more number of components. Further, the labels or names of the components are used only for illustrative purpose and does not limit the scope of the disclosure. One or more components may be combined together to perform same or substantially similar function in the transmitter circuit 106. One or more components illustrated in FIG. 2 may be implemented by hardware elements, software element or a combination of hardware and software elements.

FIG. 3A illustrates a data sampling logic 300A implemented by the DDR path. FIG. 3B illustrates another scenario of the data sampling logic 300B implemented by the DDR path. A combination of positive edge triggered flip-flops (FF) for a first half of the bus, and negative edge triggered flip-flops for a second half (i.e., other half) of the bus are used to sample the data on a positive edge and a negative edge respectively. The output of these flip-flops is used to form a bus and sampled at the positive edge.

FIG. 4 illustrates waveforms 400 of clock signals, input data, and output data of the data sampling logic. A set of positive edge triggered flip-flops are used to sample the data. However, clock to half of the bus of these flip-flops is inverted to achieve negative edge triggered. The output of these flip-flops is used to form a bus and sampled at the positive edge.

Figure 5:
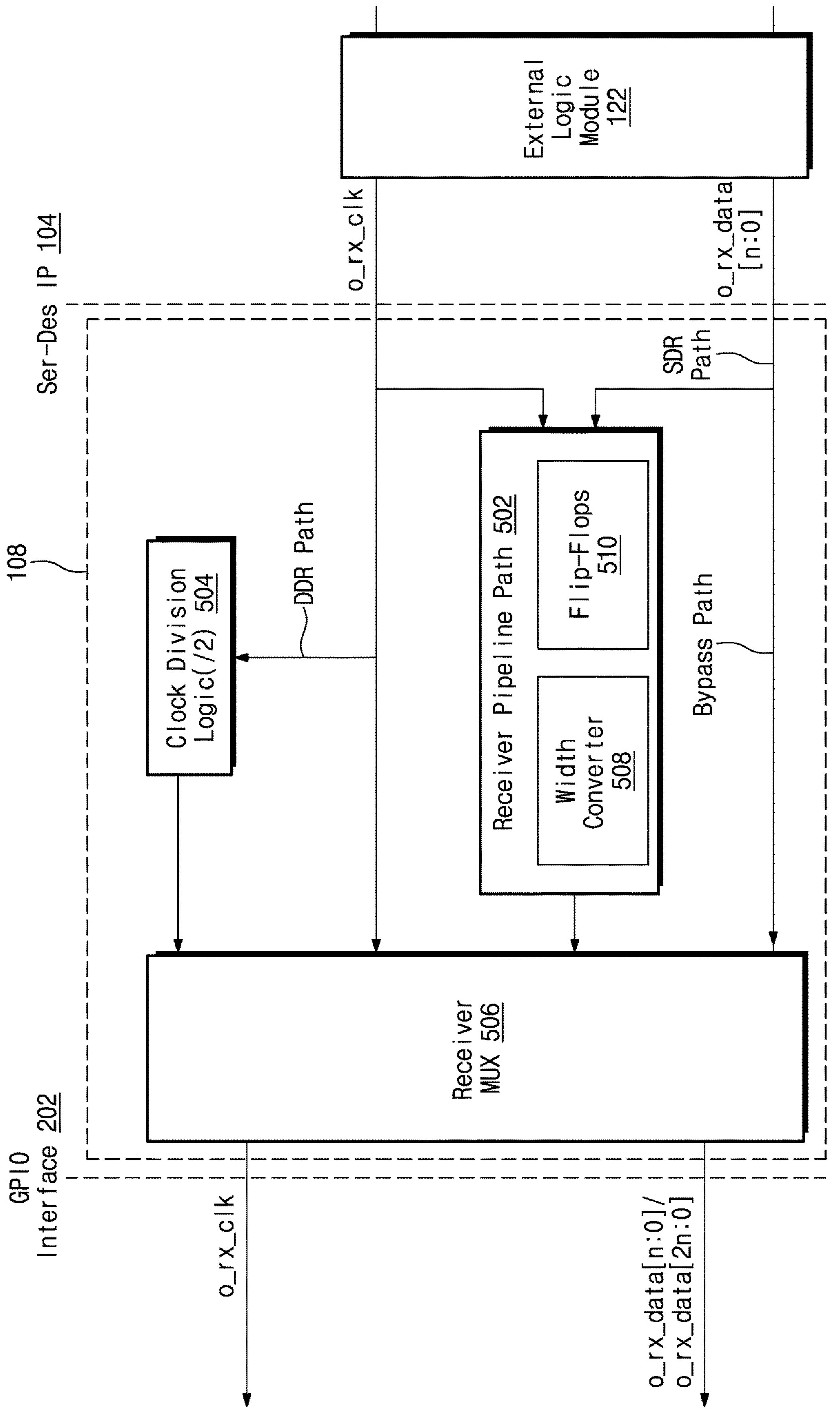
FIG. 5 illustrates a receiver circuit of the Ser-Des test chip according to an example embodiment of the disclosure.

FIG. 5 illustrates a receiver circuit 108 of the Ser-Des test chip 100. The receiver circuit 108 is connected to the external logic module 122 at the Ser-Des IP 104. The receiver circuit 108 includes a receiver pipeline path 502, a clock division logic 504, and a receiver MUX 506. The receiver circuit 108 further includes a bypass path, an SDR path, and a DDR path for the data transfer. The receiver circuit 108 converts the received high speed transmitter's serial output data back into parallel output data. The external logic module 122 is connected to the Ser-Des IP 104.

According to an example embodiment, the test chip logic module 102 transmits the data signals from the output data (o_rx_data[n:0]) which is received at the Ser-Des IP 104. The external logic module 122 decides the data rate of the output data and configures the test chip logic module 102 for enabling at least one receive path. Further, the receiver circuit 108 receives clk signals (o_rx_clk) at the Ser-Des IP 104 through the test chip logic module 102 and provides the clk signals to the bypass path, the SDR path, the DDR path, and the receiver MUX 506. The receiver circuit 108 enables at least one of the bypass path, the SDR path, and the DDR path based on the data rate.

According to an example embodiment, the receiver circuit 108 enables the bypass path for receiving the output data, if the external logic module 122 decides and configures the test chip logic module 102 to receive the output data signal which is a very low data rate or constant data signal. The bypass path transfers the output data with a very low data rate or constant data signal from the Ser-Des IP 104 to the receiver MUX 506, for performing the DC level tests. For example, in case of DC level characterization, static zeroes or ones are needed. Therefore, in the bypass path, the external logic module 122 may simply receive continuous zeroes or ones.

According to an example embodiment, the receiver circuit 108 enables the SDR path as indicated by the test chip logic module 102 based on the data rate of the output data which is less than the I/O speed limit. The receiver circuit 108 enables the SDR path when the output data needs to be driven at the single data transfer rate. The SDR path transfers the output data to the receiver pipeline path 502 for enabling the single data transfer rate to the receiver MUX 506 at the GPIO interface 202. For example, in cases where the latency level checks are needed, a simple pipeline path with low latency can deliver the data.

When the external logic module 122 decides that the data rate is more than the I/O speed limit, then the external logic module 122 verifies the Ser-Des test chip 100 GPIO pins availability. If there is a required number of GPIO pins available at the GPIO interface 202, then the external logic module 122 configures the test chip logic module 102 and the receiver circuit 108 enables the SDR path for increasing the data bus width for the single data transfer rate. The SDR path transfers the output data to the receiver pipeline path 502 for increasing the data bus width and allowing the single data transfer rate to the receiver MUX 506 at the GPIO interface 202. Further, the clk signals are given to the receiver pipeline path 502 for providing the single data transfer rate.

According to an example embodiment, the receiver pipeline path 502 includes a width converter 508 and multiple flip-flops (FF) 510. The receiver pipeline path 502 utilizes the flip-flops 510 and the clk signals to output the data with single data transfer rate to the receiver MUX 506, when the output data needs to be driven at the single data transfer rate.

The receiver pipeline path 502 utilizes the width converter 508 to operate at increased data bus width, if the data rate is more than the I/O speed limit. Further, the receiver pipeline path 502 utilizes the flip-flops 510 and the clk signals to output the data with single data transfer rate to the receiver MUX 506, for the increased data bus width.

According to an example embodiment, the receiver circuit 108 enables the DDR path for doubling the data transfer rate, when the data rate of the output data is more than the I/O speed limit, and the bus width is limited. The output data is driven to the double data transfer rate. The DDR path utilizes the clock division logic 504 to divide the output clock of the output data by two, for allowing the double data transfer rate to the receiver MUX 506 at the GPIO interface 202. The receiver MUX 506 further provides a parallel data output (o_rx_data[n:0]/o_rx_data[2n:0]) at the GPIO interface 202.

FIG. 5 shows example components of the receiver circuit 108, but it is to be understood that other example embodiments are not limited thereon. In other example embodiments, the receiver circuit 108 may include less or more number of components. Further, the labels or names of the components are used only for illustrative purpose and does not limit the scope of the disclosure. One or more components can be combined together to perform same or substantially similar function in the receiver circuit 108. One or more components illustrated in FIG. 2 may be implemented by hardware elements, software element or a combination of hardware and software elements.

Figure 6:
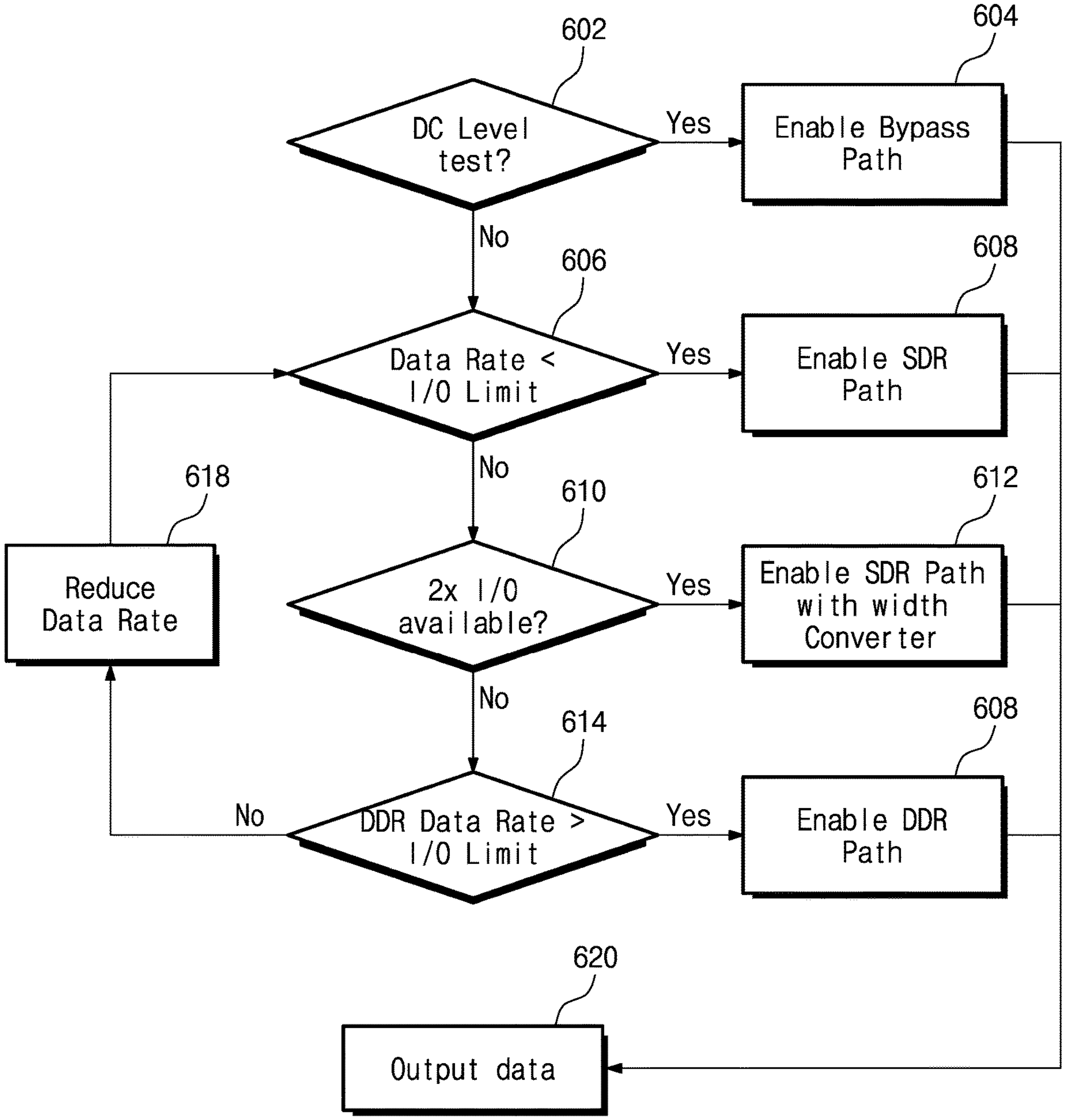
FIG. 6 shows a method for managing the interoperability data rate range of the Ser-Des test chip either by the transmitter circuit or by the receiver circuit according to an example embodiment of the disclosure.

FIG. 6 shows a method 600 for managing the interoperability data rate range of the Ser-Des test chip 100 according to an example embodiment. For example, the method 600 shown in FIG. 6 may be used for managing the interoperability data rate range of the Ser-Des test chip 100 either by the transmitter circuit 106 or by the receiver circuit 108. The method 600 begins with verifying whether the DC level test is required, as depicted in operation 602. The DC level test is verified based on the data rate of the data. Subsequently, the method 600 includes enabling the bypass path, as depicted in operation 604 and providing output data as depicted in operation 620, if the data rate is very low or constant data signal indicating that the DC level test is required. Otherwise, the method 600 includes verifying whether the data rate is less than the I/O speed limit, as depicted in operation 606, if the data rate is not low or data is not constant indicating that the DC level test is not required.

Thereafter, the method 600 includes enabling the SDR path, as depicted in operation 608 and providing output data as depicted in operation 620, if the data rate is less than the I/O speed limit for a single data transfer rate or when the data needs to be driven at the SDR path. If the data rate is not less than the I/O speed limit, then the method 600 includes verifying whether the required number of I/O pins is available at the Ser-Des test chip interface, for increasing a data bus width for the single data transfer rate, as depicted in operation 610. Later, the method 600 includes enabling the SDR path with the width converter, as depicted in operation 612 and providing output data as depicted in operation 620, if the required number of I/O pins is available at the Ser-Des test chip interface.

If the required number of I/O pins is not available at the Ser-Des test chip interface, then the method 600 includes verifying whether the data rate is greater than the I/O speed limit for doubling the data transfer rate, as depicted in operation 614. If the data rate is greater than the I/O speed limit or when the data needs to be driven at the DDR path, then the method 600 includes enabling the DDR path, as depicted in operation 616 and providing output data as depicted in operation 620. If the data rate is not greater than the I/O speed limit, then the method 600 includes reducing the data rate, as depicted in operation 618 and repeating the operation 606 for verifying whether the data rate signal is less than the I/O speed limit.

The various actions in method 600 may be performed in the order presented, in a different order or simultaneously. Further, in some embodiments, some actions listed in FIG. 6 may be omitted.

According to an example embodiment, "modules", "units", "engines" and/or other components of the disclosure may be implemented by hardware, software or a combination of hardware and software. For example, these components may be implemented by processors or electronic circuits. According to another example embodiment, these components may be software units implemented by program codes or instructions stored in the memory device, which may be executed by a processor to perform one or more operations. According to an example embodiment, the processor may be a special processor for performing the corresponding one or more operations (for example, an embedded processor) or a common processor for performing the corresponding one or more operations by performing at least one software program stored in the memory device (for example, a central processing unit (CPU) or an application processor (AP)).

The foregoing description of the specific embodiments will so fully reveal the general nature of the embodiment of the disclosure that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiment of the disclosure have been described in terms of embodiments and examples, those skilled in the art will recognize that the embodiments and examples disclosed herein can be practiced with modification within the spirit and scope of the embodiments as described herein.

What is claimed is:

1. A method for managing an interoperability data rate range of a serializer/deserializer (Ser-Des) test chip connected between an external device and a Ser-Des interoperability (IP) and including a first transmit path, a second transmit path and a third transmit path, the method comprising:

receiving, by a transmitter circuit of the Ser-Des test chip, a data rate of at least one input data from the external device through a first interface, the transmitter circuit including a multiplexer, enabling the first transmit path for transferring the at least one input data for performing Direct Current (DC) level tests based on the data rate of the at least one input data being a first very low data rate or a first constant data signal, the first very low data rate being below a reference data rate;

enabling the second transmit path for a single data transfer rate based on the data rate of the at least one input data being less than an Input/Output (I/O) speed limit, the second transmit path including a width converter configured to increase a data bus width and a plurality of first flip-flops;

verifying, by the external device, a number of I/O pins available at a second interface between the Ser-Des test chip and the Ser-Des IP;

enabling the second transmit path to increase the data bus width, by the width converter, for the single data transfer rate based on the data rate of the at least one input data being more than the I/O speed limit and based on the verified number of I/O pins available at the second interface being more than or equal to a required number of I/O pins at the second interface for the single data transfer rate;

enabling a third transmit path for doubling the single data transfer rate based on the data rate of the at least one input data being more than the I/O speed limit and based on the verified number of I/O pins being less than the required number of I/O pins, the third transmit path including logic to convert the data rate of the at least one input data and a plurality of second flip-flops; and transmitting, by the multiplexer, the at least one input data output by one of the first transmit path, the second transmit path and the third transmit path, to the Ser-Des IP through the second interface.

2. The method of claim 1, further comprises:

determining, by the external device, the data rate of the at least one input data received at a plurality of I/O pins.

3. The method of claim 1, further comprises:

receiving, by a receiver circuit of the Ser-Des test chip, a data rate of an output data from the external device;

enabling a first receive path for receiving the output data for performing DC level tests based on the data rate of the output data being a second very low data rate or a second constant data signal, the second very low data rate being below the reference data rate;

enabling a second receive path for the single data transfer rate based on the data rate of the output data being less than the I/O speed limit;

enabling the second receive path for increasing the data bus width for the single data transfer rate based on the data rate of the output data being more than the I/O speed limit and based on a required number of I/O pins available at the second interface of the Ser-Des test chip; and enabling a third receive path for doubling the data transfer rate based on the data rate of the output data being more than the I/O speed limit and the data bus width is limited.

4. The method of claim 3, further comprises:

determining, by the external device, the data rate of the output data received at the Ser-Des IP.

5. The method of claim 3, wherein the first transmit path or the first receive path is a bypass path, wherein the second transmit path or the second receive path is a single data rate (SDR) path, and wherein the third transmit path or the third receive path is a double data rate (DDR) path.

6. The method of claim 5, wherein the DDR path utilizes a data sampling technique and a data splitter for providing the double data rate, and wherein the data sampling technique is based on a combination of the SDR and the DDR.

7. The method of claim 5, wherein the DDR path utilizes a divider logic to divide an output clock corresponding to the output data by two when driving the output data to the DDR path.

8. The method of claim 5, wherein a combination of the bypass path, the SDR path, and the DDR path in the transmitter circuit and the receiver circuit is implemented as a general purpose (I/O) (GPIO) adapter for communication between a first chip to a second chip.

9. The method of claim 1, wherein the Ser-Des test chip receives the data rate of at least one input data and, before receiving the at least one input data, enables one of the first transmit path, the second transmit path or the third transmit path based on the data rate of at least one input data.

10. The method of claim 9, wherein the Ser-Des test chip separately receives the at least one input data after enabling the one of the first transmit path, the second transmit path or the third transmit path based on the data rate of at least one input data.

11. A serializer/deserializer (Ser-Des) test chip connected between an external device and a Ser-Des interoperability (IP) comprising:

a transmitter circuit comprising a multiplexer, the transmitter circuit configured to:

receive a data rate of at least one input data from the external device through a first interface, receive information regarding a number of I/O pins available at a second interface between the Ser-Des test chip and the Ser-Des IP from the external device through the first interface, and enable at least one transmit path from among a plurality of transmit paths based on the data rate of the at least one input data and the number of I/O pins available at the second interface, wherein the plurality of transmit paths comprises:

a first transmit path that transfers the at least one input data for performing Direct Current (DC) level tests based on the data rate of the at least one input data being a first very low data rate or a first constant data signal, the first very low data rate being below a reference data rate;

a second transmit path that implements for a single data transfer rate based on the data rate of the at least one input data being less than an I/O speed limit, and comprising a width converter that increases a data bus width for the single data transfer rate based on the data rate of the at least one input data being more than the I/O speed limit and based on the number of I/O pins available at the second interface being more than or equal to a required number of I/O pins for the single data transfer rate, the second transmit path further comprising a plurality of first flip-flops; and a third transmit path comprising logic that converts the data rate of the at least one input data by doubling the single data transfer rate based on the data rate of the at least one input data being more than the I/O speed limit and based on the number of I/O pins available at the second interface being less than the required number of I/O pins, the third transmit path further comprising a plurality of second flip-flops, wherein the multiplexer is configured to transmit the at least one input data, output by one of the first transmit path, the second transmit path and the third transmit path, to the Ser-Des IP through the second interface.

12. The Ser-Des test chip of claim 11, wherein the data rate of the at least one input data received at a plurality of input and output (I/O) pins is determined by the external device.

13. The Ser-Des test chip of claim 11, further comprises:

a receiver circuit configured to:

receive a data rate of an output data from the external device; and enable at least one receive path from among a plurality of receive paths based on the data rate of the output data, wherein the plurality of receive paths comprises:

a first receive path that receives the output data for performing the Direct Current (DC) level tests based on the data rate of the output data being a second very low data rate or a second constant data signal, the second very low data rate being below the reference data rate;

a second receive path that implements the single data transfer rate based on the data rate of the output data being less than the I/O speed limit, and increases the data bus width for the single data transfer rate based on the data rate of the output data being more than the I/O speed limit and based on a required number of I/O pins available at the second interface; and a third receive path that doubles the data transfer rate based on the data rate of the output data being more than the I/O speed limit and the data bus width being limited.

14. The Ser-Des test chip of claim 13, wherein the data rate of the output data is determined by the external device.

15. The Ser-Des test chip of claim 13, wherein the first transmit path or the first receive path is a bypass path, wherein the second transmit path or the second receive path is a single data rate (SDR) path, and wherein the third transmit path or the third receive path is a double data rate (DDR) path.

16. The Ser-Des test chip of claim 15, wherein the DDR path utilizes a data sampling technique and a data splitter that provides a double data rate, and wherein the data sampling technique is based on a combination of the SDR and the DDR.

17. The Ser-Des test chip of claim 15, wherein the DDR path utilizes a divider logic to divide an output clock corresponding to the output data by two when driving the output data to the DDR path.

18. The Ser-Des test chip of claim 15, wherein a combination of the bypass path, the SDR path, and the DDR path in the transmitter circuit and the receiver circuit is implemented as a general purpose (I/O) (GPIO) adapter for communication between a first chip to a second chip.

19. A method for managing an interoperability data rate range of a serializer/deserializer (Ser-Des) test chip connected between an external device and a Ser-Des interoperability (IP), the method comprising:

verifying, by the external device, a number of I/O pins currently available at a second interface between the Ser-Des test chip and the Ser-Des IP;

enabling, by a transmitter circuit of the Ser-Des test chip, at least one transmit path from among a bypass path, a single data rate (SDR) path, and a double datarate (DDR) path based on a data rate of at least one input data received at a plurality of input and output (I/O) pins of the Ser-Des test chip and based on the verified number of I/O pins available at the second interface, the transmitter circuit including a multiplexer, enabling, by a receiver circuit of the Ser-Des test chip, at least one receive path from among the bypass path, the SDR path, and the DDR path based on a data rate of an output data received from the external device through a first interface and based on the verified number of I/O pins available at the second interface, wherein the bypass path for transferring the at least one input data for performing Direct Current (DC) level tests is enabled by the transmitter circuit based on the data rate of the at least one input data being a first very low data rate or a first constant data signal, the first very low data rate being below a reference data rate; and transmitting, by the multiplexer, the at least one input data output by one of the bypass path, the SDR path, and the DDR path, to the Ser-Des IP through a second interface, wherein the SDR path for a single data transfer rate is enabled by the transmitter circuit based on the data rate of the at least one input data being less than an Input/Output (I/O) speed limit, the SDR path including a width converter configured to increase a data bus width and a plurality of first flip-flops, wherein the SDR path for increasing, by the width converter, the data bus width for the single data transfer rate is enabled by the transmitter circuit based on the data rate of the at least one input data being more than the I/O speed limit and based on the verified number of I/O pins available at the second interface being more than or equal to a required number of I/O pins at the second interface for the single data transfer rate, wherein the DDR path for doubling the data transfer rate is enabled by the transmitter circuit based on the data rate of the at least one input data being more than the I/O speed limit and based on the verified number of I/O pins being less than the required number of I/O pins, the DDR path including logic to convert the data rate of the at least one input data and a plurality of second flip-flops, wherein the bypass path for receiving the output data for performing Direct Current (DC) level tests is enabled by the receiver circuit based on the data rate of the output data being a second very low data rate or a second constant data signal, the second very low data rate being below the reference data rate, wherein the SDR path for the single data transfer rate is enabled by the receiver circuit based on the data rate of the output data being less than the I/O speed limit, wherein the SDR path for increasing the data bus width for the single data transfer rate is enabled by the receiver circuit based on the data rate of the output data being more than the I/O speed limit and based on the verified number of I/O pins available at the second interface being more than or equal to the required number of I/O pins at the second interface for the single data transfer rate, and wherein the DDR path for doubling the data transfer rate is enabled by the receiver circuit based on the data rate of the output data being more than the I/O speed limit and based on the verified number of I/O pins being less than the required number of I/O pins, and wherein the DDR path divides an output clock corresponding to the output data by two.

20. A serializer/deserializer (Ser-Des) test chip connected between an external device and a Ser-Des interoperability (IP) comprising:

a transmitter circuit comprising a multiplexer, the transmitter circuit configured to enable at least one transmit path from among a bypass path, a single data rate (SDR) path, and a double data rate (DDR) path based on a data rate of at least one input data received at a plurality of input and output (I/O) pins from the external device through a first interface and based on information regarding a number of I/O pins available at a second interface between the Ser-Des test chip and the Ser-Des IP received through the first interface; and a receiver circuit configured to enable at least one receive path from among the bypass path, the SDR path, and the DDR path based on a data rate of an output data received from the external device and based on the information regarding the number of I/O pins available at the second interface received from the external device, wherein the bypass path that transfers the at least one input data for performing Direct Current (DC) level tests is enabled by the transmitter circuit based on the data rate of the at least one input data being a first very low data rate or a first constant data signal, the first very low data rate being below a reference data rate, wherein the SDR path that implements a single data transfer rate is enabled by the transmitter circuit based on the data rate of the at least one input data being less than an Input/Output (I/O) speed limit, the SDR path comprising a width converter that increases a data bus width and a plurality of first flip-flops, wherein the SDR path that increases a data bus width for the single data transfer rate is enabled by the transmitter circuit based on the data rate of the at least one input data being more than the I/O speed limit and based on the number of I/O pins available at the second interface between the Ser-Des test chip and the Ser-Des IP being more than or equal to a required number of I/O pins for the single data transfer rate, wherein the DDR path that doubles the data transfer rate is enabled by the transmitter circuit based on the data rate of the at least one input data being more than the I/O speed limit and based on the number of I/O pins available being less than the required number of I/O pins, the DDR path comprising logic to convert the data rate of the at least one input data and a plurality of second flip-flops, wherein the bypass path that receives the output data for performing Direct Current (DC) level tests is enabled by the receiver circuit based on the data rate of the output data being a second very low data rate or a second constant data signal, the second very low data rate being below the reference data rate, wherein the SDR path that implements the single data transfer rate is enabled by the receiver circuit based on the data rate of the output data being less than the I/O speed limit, wherein the SDR path that increases the data bus width for the single data transfer rate is enabled by the receiver circuit based on the data rate of the output data being more than the I/O speed limit and based on the number of I/O pins available at the second interface between the Ser-Des test chip and the Ser-Des IP being more than or equal to the required number of I/O pins for the single data transfer rate, wherein the DDR path that doubles the data transfer rate is enabled by the receiver circuit based on the data rate of the output data being more than the I/O speed limit and based on the number of I/O pins available being less than the required number of I/O pins, and wherein the DDR path divides an output clock corresponding to the output data by two, and wherein the multiplexer is configured to transmit the at least one input data, output by one of the bypass path, the SDR path, and the DDR path, to the Ser-Des IP through the second interface.

* * * * *